United States Patent
Lee

(10) Patent No.: US 7,173,870 B2
(45) Date of Patent: Feb. 6, 2007

(54) DUAL OPERATION MODE MEMORY DEVICE

(75) Inventor: Eun Suk Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/104,136

(22) Filed: Apr. 12, 2005

(65) Prior Publication Data

US 2006/0140035 A1    Jun. 29, 2006

(30) Foreign Application Priority Data

Dec. 28, 2004    (KR)    ..................... 10-2004-0113816

(51) Int. Cl.
*G11C 7/00*    (2006.01)
(52) U.S. Cl. .................. 365/222; 365/230.01
(58) Field of Classification Search ................ 365/222, 365/230.01
See application file for complete search history.

(56) References Cited

U.S. PATENT DOCUMENTS

| | | | |
|---|---|---|---|
| 6,487,136 B2* | 11/2002 | Hidaka | 365/222 |
| 6,515,928 B2* | 2/2003 | Sato et al. | 365/222 |
| 2004/0027888 A1* | 2/2004 | Kurita | 365/202 |
| 2005/0018568 A1* | 1/2005 | Tsuda et al. | 369/47.32 |
| 2005/0117432 A1* | 6/2005 | Graaff et al. | 365/226 |

* cited by examiner

*Primary Examiner*—Michael Tran
(74) *Attorney, Agent, or Firm*—Ladas & Parry LLP

(57) ABSTRACT

Disclosed is a memory device, which combines a self-refresh enable signal and a power mode decision signal and prevents an internal voltage from being dropped down without the increase of IDD3P current when the memory device performs a self-refresh operation. The memory device includes an operation mode internal voltage generator used in an operation mode, and a controller for enabling the operation mode internal voltage generator while performing a self-refresh operation with a predetermined period and activating a memory cell array of the memory device, even when the memory device is in a stand-by mode.

4 Claims, 2 Drawing Sheets

DUAL OPERATION MODE MEMORY DEVICE

BACKGROUND OF THE INVENTION

1. Field of the Invention

The present invention relates to a memory device, and more particularly to a memory device, which combines a self-refresh enable signal and a power mode decision signal, thereby preventing an internal voltage Vcore from being dropped down without the increase of IDD3P current when the memory device performs a self-refresh operation.

2. Description of the Prior Art

Generally, a memory device includes an operation state and a stand-by state. In a stand-by state, a memory device performs a self-refresh operation for preservation of storage data. In a self-refresh operation, a memory device changes into a low power operation mode, thereby minimizing the power consumption, in contrast with an auto-refresh operation performed when the memory device is in an operation state. For this, the memory device uses only a stand-by mode internal voltage generator used in only a stand-by state instead of an operation mode internal voltage generator used in an operation state, thereby minimizing power consumption.

However, in the stand-by state of the memory device, operation characteristics of the stand-by mode internal voltage generator may change according to the change of pressure, volume and temperature. This change in the operation characteristics of the stand-by mode internal voltage generator may cause the increase of power consumption and become a factor of dropping down the voltage level of an internal voltage Vcore which is an output voltage.

The drop of the voltage level of the internal voltage has influence on an operation of a sense amplifier. Specifically, in a state in which the voltage level of the internal voltage is abnormally dropped down, the threshold voltage Vt of an NMOS transistor included in the sense amplifier may increase according to the change of a process, a voltage and temperature. Herein, the internal voltage having the dropped voltage level causes the voltage level of a bit line precharge voltage (Vblp=1/2Vcore) detected by the sense amplifier to be dropped down. Accordingly, the bit line precharge voltage Vblp having the dropped voltage level does not turn on an NMOS transistor for detecting data '0' (i.e., 'logic low') stored in a memory cell, so that the sense amplifier does not normally operate.

As a result, in the stand-by state of the memory device, the voltage level of the internal voltage is dropped down, so that the sense amplifier may abnormally operate. The abnormal operation of the sense amplifier disturbs a normal self-refresh operation of the memory device.

In the prior art, in order to prevent the drop of the voltage level of the internal voltage when the memory device performs the self-refresh operation as described above, the operation mode internal voltage generator is used together with the stand-by mode internal voltage generator, so that the voltage level of the internal voltage can be constantly maintained. However, the conventional method may also increase IDD3P current used when the memory device is in a low power operation mode. Herein, the IDD3P current represents electric current used when the memory device is in the low power operation mode, that is, electric current consumed when only one bank of multiple banks included in the memory device is used.

FIG. 1 is a circuit diagram showing an operation mode entrance circuit of a memory device according to the prior art.

The conventional operation mode entrance circuit includes an input means 100 for receiving a clock enable signal CKE and a word line active command signal ACT, and a decoding means 110 for combining the clock enable signal CKE and the word line active command signal ACT, which are transferred through the input means 100, and outputting the combined signal.

In the conventional operation mode entrance circuit including the construction as described above, when the word line active command signal ACT is enabled to be in a 'logic high' state, whether an operation mode internal voltage generator operates or not is determined according to the state of the clock enable signal CKE. In other words, in a state where the word line active command signal ACT is enabled to be in the 'logic high' state, when the clock enable signal CKE is inputted in a 'logic low' state, the operation mode internal voltage generator does not operate. In contrast, when the clock enable signal CKE is inputted in a 'logic high' state, the operation mode internal voltage generator operates. That is, the clock enable signal CKE in the 'logic high' state represents an operation state of the memory device. In contrast, the clock enable signal CKE in the 'logic low' state represents a low power operation mode which is a stand-by state of the memory device.

Herein, a self-refresh operation of the memory device is performed in the stand-by state of the memory device, that is, the low power operation mode. Accordingly, in order to prevent the voltage level of an internal voltage from being dropped down in the self-refresh operation, when the operation mode internal voltage generator operates according to the conventional method, IDD3P current, which is electric current in the low power operation mode, may also increase. Therefore, it is difficult to operate the memory device with low power.

SUMMARY OF THE INVENTION

Accordingly, the present invention has been made to solve the above-mentioned problems occurring in the prior art, and an object of the present invention is to provide a memory device capable of preventing an internal voltage from being dropped down without the increase of IDD3P current when the memory device performs a self-refresh operation.

In order to achieve the above objects, according to one aspect of the present invention, there is provided a memory device comprising: an operation mode internal voltage generator used in an operation mode; and a controller for enabling the operation mode internal voltage generator while performing a self-refresh operation with a predetermined period and activating a memory cell array of the memory device, even when the memory device is in a stand-by mode.

In the present invention, the controller comprises: a self-refresh mode detector for detecting whether the self-refresh operation is performed or not; and an operation mode entrance unit for receiving an output signal of the self-refresh mode detector, a clock enable signal and a signal for determining an activation of a word line, wherein whether the operation mode internal voltage generator is enabled or not is determined in response to an output signal of the operation mode entrance unit.

In the present invention, when the memory device is in the stand-by mode, the clock enable signal is a logic low state, and when the memory device is in the operation mode, the clock enable signal is a logic high state, and the signal for determining the activation of the word line is a logic high state.

In the present invention, when the memory device is in the operation mode, the operation mode internal voltage generator is enabled in response to the output signal of the operation mode entrance unit, and when the memory device is in the stand-by mode, the self-refresh operation is detected by the self-refresh mode detector and the operation mode internal voltage generator is enabled only while the signal for determining the activation of the word line is enabled.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
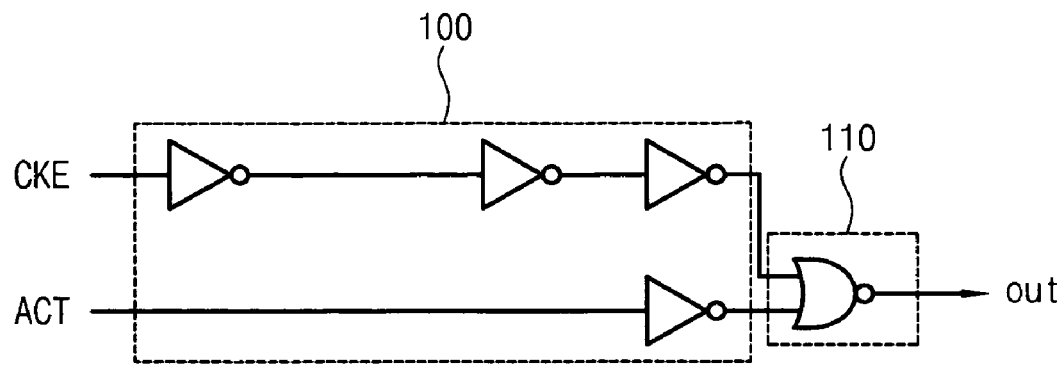
FIG. 1 is a circuit diagram showing an operation mode entrance circuit of a memory device according to the prior art.
Figure 2:
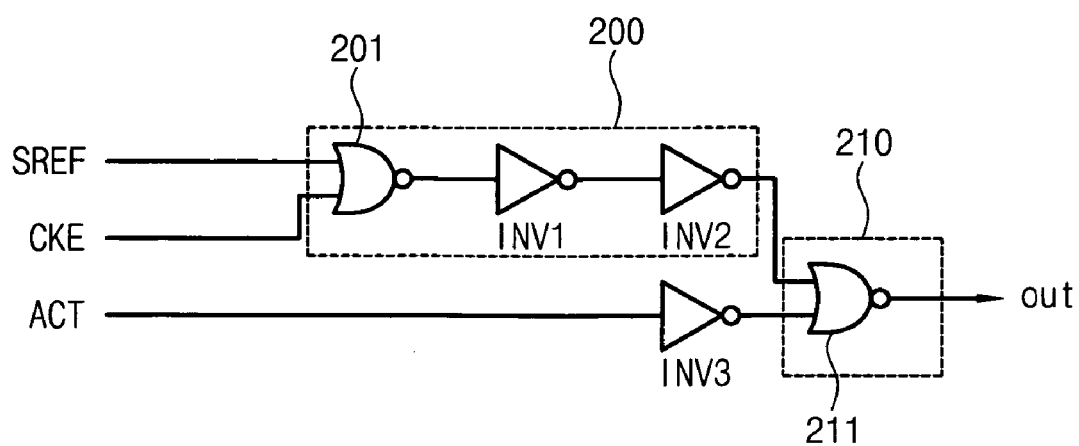
FIG. 2 is a circuit diagram showing an operation mode entrance circuit of a memory device according to the present invention.

FIG. 2 is a circuit diagram showing an operation mode entrance circuit of a memory device according to the present invention.

The operation mode entrance circuit according to the present invention includes a first decoding means 200 and a second decoding means 210.

The first decoding means 200 includes a first NOR gate 201 and an even number of inverters INV1 and INV2 connected in series with each other. The first NOR gate 201 receives a refresh operation command signal SREF and a clock enable signal CKE, and outputs the NOR operated signal. The inverters INV1 and INV2 drive and output the output signal of the first NOR gate 201. Herein, the refresh operation command signal SREF is a signal for starting the self-refresh operation of the memory device and maintains an enable state in a 'logic high' state during the self-refresh operation.

The second decoding means 210 includes a second NOR gate 211 for receiving the output signal of the first decoding means 200 and a word line active command signal ACT inverted by an inverter INV3.

Hereinafter, an operation of the operation mode entrance circuit, which includes the construction as described above, of the memory device according to the present invention will be described.

Specifically, an operation when the memory device is in a stand-by state, that is, a low power operation mode, will be described. Herein, when the memory device is in the stand-by state, the clock enable signal CKE is in a 'logic low' state. Further, the stand-by state may be classified into a case where the self-refresh operation is not performed and a case where the self-refresh operation is performed.

First, the case where the self-refresh operation is not performed in the stand-by state will be described. In this case, since the self-refresh operation is not performed, the refresh operation command signal SREF is in a 'logic low' state. Accordingly, an output of the first decoding means 200 is in a 'logic high' state. As a result, an output of the second decoding means 210 is in a 'logic low' state. That is, since it is not necessary to use an operation mode internal voltage generator when the self-refresh operation is not performed in the stand-by state, it is apparent that the output of the second decoding means 210 is in the 'logic low' state. In other words, in this case, since it is necessary to operate only a stand-by mode internal voltage generator and it is not necessary to operate the operation mode internal voltage generator for operating a memory cell array, it is apparent that the output of the second decoding means 210 is in the 'logic low' state.

Next, the case where the self-refresh operation is performed in the stand-by state will be described. In this case, since the self-refresh operation is performed, the refresh operation command signal SREF is in a 'logic high' state. Accordingly, the output of the first decoding means 200 is in a 'logic low' state. As a result, the output of the second decoding means 210 is determined according to the word line active command signal ACT.

Herein, the refresh operation command signal SREF is in the 'logic high' state, a logic level of the word line active command signal ACT may be in a 'logic low' state or a 'logic high' state. The case where the word line active command signal ACT is in the 'logic high' state represents an interval in which an activation operation for a memory cell array is actually performed. In contrast, the case where the word line active command signal ACT is in the 'logic low' state represents an interval in which an activation operation for a memory cell array is not performed.

Accordingly, the refresh operation command signal SREF is in the 'logic high' state and the word line active command signal ACT is in the 'logic low' state, the output of the second decoding means 210 is in the 'logic low' state. Consequently, only the stand-by mode internal voltage generator is activated and the operation mode internal voltage generator maintains a disable state.

Further, the refresh operation command signal SREF is in the 'logic high' state and the word line active command signal ACT is in the 'logic high' state, the output of the second decoding means 210 is in the 'logic high' state. Accordingly, the operation mode internal voltage generator is enabled. As a result, the refresh operation command signal SREF is in the 'logic high' state and the word line active command signal ACT is in the 'logic high' state, one can see that both the stand-by mode internal voltage generator and the operation mode internal voltage generator are activated. Consequently, it is possible to stably perform a refresh operation for the memory cell array.

The operation of the present invention described with reference to FIG. 2 is summarized as follows.

In general, the memory device includes the stand-by mode internal voltage generator and the operation mode internal voltage generator. The stand-by mode internal voltage generator is used in a stand-by mode having low power consumption and always maintains an enable state in the stand-by mode. The operation mode internal voltage generator is used when a refresh operation is actually performed for the memory cell array and is enabled only while a word line is activated.

That is, the operation mode internal voltage generator of the memory device must be enabled only when it is necessary to directly activate the memory cell array.

Accordingly, when the refresh operation command signal SREF has been activated but the signal ACT for activating the word line has not been activated in the stand-by mode, it is not necessary to activate the operation mode internal voltage generator. Consequently, in this case, the output signal 'out' of FIG. 2 is at a low level.

In contrast, when both the refresh operation command signal SREF and the signal ACT for activating the word line have been activated in the stand-by mode, it is necessary to activate the operation mode internal voltage generator. Consequently, in this case, the output signal 'out' of FIG. 2 is at a high level.

The description up to now corresponds to a case in which the memory device is in the stand-by state. If the memory device is in an operation mode, the output signal 'out' of the decoding means 210 in FIG. 2 is always at a high level because both the clock enable signal CKE and the word line active command signal ACT maintain the 'logic high' state. Accordingly, when the memory device is in the operation mode, the operation mode internal voltage generator is always in an enable state.

Figure 3:
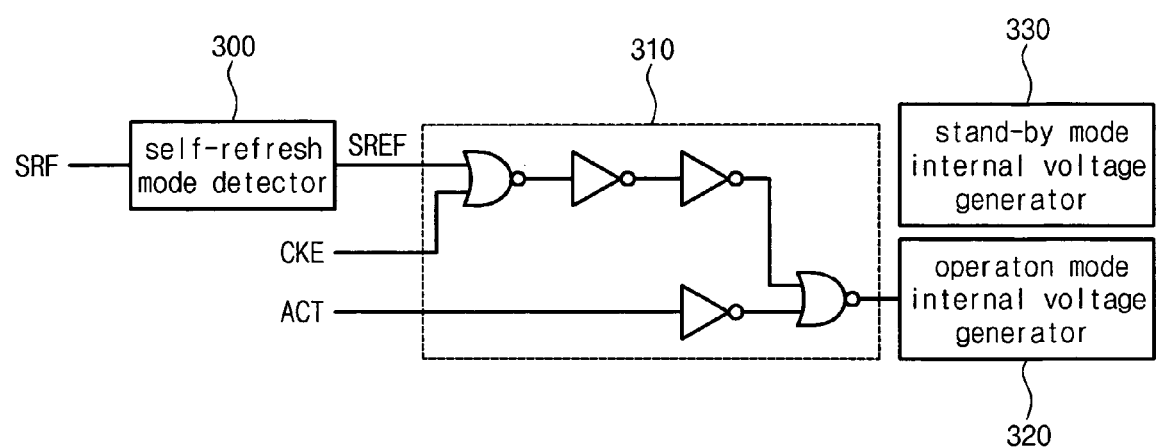
FIG. 3 is a block diagram describing in detail the operation of the circuit described with reference to FIG. 2.

FIG. 3 is a block diagram illustrating in detail a concept of the present invention described with reference to FIG. 2. FIG. 3 illustrates an internal voltage generator of the memory device, which operates according to a stand-by mode or an operation mode.

In FIG. 3, a self-refresh mode detector 300 is a circuit for outputting a logic level of a high level when receiving a self-refresh flag SRF representing a self-refresh mode, and those who skilled in the art can variously construct a circuit having this function. The output SREF of the self-refresh mode detector 300 represents the refresh operation command signal SREF of FIG. 2.

Since the operation mode entrance circuit 310 of FIG. 3 is described with reference to FIG. 2, an additional description will be omitted.

As shown in FIG. 3, the operation mode internal voltage generator 320 is enabled or disabled by the output signal of the operation mode entrance circuit 310. As described in FIG. 2, the operation mode internal voltage generator 320 maintains an enable state when the memory device is in the operation mode. Further, even in a case in which the memory device is in the stand-by mode, the operation mode internal voltage generator 320 maintains the enable state while the word line active command signal ACT maintains a high level in a self-refresh state, thereby stably supplying an internal voltage to a memory cell array region. Further, the stand-by mode internal voltage generator 330 of FIG. 3 always maintains an enable state when the memory device is in the stand-by mode.

As described above, in the present invention, when the memory device is in a stand-by mode, a stand-by mode internal voltage generator is basically used. However, when the memory device periodically performs a self-refresh operation requiring a large power consumption while the stand-by mode continues, an operation mode internal voltage generator is enabled so as to achieve a stable refresh operation.

According to the present invention as described above, a refresh operation command signal SREF and a clock enable signal CKE are combined, thereby operating an operation mode internal voltage generator only in a self-refresh operation. Therefore, it is possible to prevent the voltage level of an internal voltage from being dropped down without the increase of IDD3P current.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A memory device comprising:

an operation mode internal voltage generator used in an operation mode; and a controller for enabling the operation mode internal voltage generator while performing a self-refresh operation with a predetermined period and activating a memory cell array of the memory device, even when the memory device is in a stand-by mode, said controller comprised of a self-refresh mode detector for detecting whether the self-refresh operation is performed or not; and an operation mode entrance unit for receiving an output signal of the self-refresh mode detector, a clock enable signal and a signal for determining an activation of a word line, wherein whether the operation mode internal voltage generator is enabled or not is determined in response to an output signal of the operation mode entrance unit.

2. The memory device as claimed in claim 1, wherein, when the memory device is in the stand-by mode, the clock enable signal is a logic low state, and when the memory device is in the operation mode, the clock enable signal is a logic high state, and the signal for determining the activation of the word line is a logic high state.

3. The memory device as claimed in claim 2, wherein, when the memory device is in the operation mode, the operation mode internal voltage generator is enabled in response to the output signal of the operation mode entrance unit, and when the memory device is in the stand-by mode, the self-refresh operation is detected by the self-refresh mode detector and the operation mode internal voltage generator is enabled only while the signal for determining the activation of the word line is enabled.

4. The memory device as claimed in claim 2, further comprising a stand-by mode internal voltage generator for maintaining a disable state when the memory device is in the operation mode and maintaining an enable state when the memory device is in the stand-by mode.

* * * * *